United States Patent
Wu et al.

(10) Patent No.: US 9,627,455 B2
(45) Date of Patent: Apr. 18, 2017

(54) TOUCH DISPLAY DRIVING CIRCUIT, METHOD THEREOF AND DISPLAY APPARATUS

(71) Applicants: BOE TECHNOLOGY GROUP CO., LTD., Beijing (CN); CHENGDU BOE OPTOELECTRONICS TECHNOLOGY CO., LTD., Chengdu, Sichuan (CN)

(72) Inventors: Bo Wu, Beijing (CN); Xiaojing Qi, Beijing (CN); Wen Tan, Beijing (CN)

(73) Assignees: BOE TECHNOLOGY GROUP CO., LTD., Beijing (CN); CHENGDU BOE OPTOELECTRONICS TECHNOLOGY CO., LTD., Chengdu, Sichuan Province (CN)

( * ) Notice: Subject to any disclaimer, the term of this patent is extended or adjusted under 35 U.S.C. 154(b) by 268 days.

(21) Appl. No.: 14/375,640

(22) PCT Filed: Aug. 13, 2013

(86) PCT No.: PCT/CN2013/081378
§ 371 (c)(1),
(2) Date: Jul. 30, 2014

(87) PCT Pub. No.: WO2014/190621
PCT Pub. Date: Dec. 4, 2014

(65) Prior Publication Data
US 2016/0225829 A1    Aug. 4, 2016

(30) Foreign Application Priority Data
May 30, 2013  (CN) .......................... 2013 1 0210265

(51) Int. Cl.
*H01L 27/32* (2006.01)
*G06F 3/042* (2006.01)
(Continued)

(52) U.S. Cl.
CPC ............. *H01L 27/323* (2013.01); *G06F 3/042* (2013.01); *G06F 3/0416* (2013.01); *G09G 3/32* (2013.01);
(Continued)

(58) Field of Classification Search
CPC ............... G09G 3/3258; G09G 3/3275; G09G 2320/0626; G09G 2310/0251; G09F 2300/0426
See application file for complete search history.

(56) References Cited

U.S. PATENT DOCUMENTS

2005/0007353 A1* 1/2005 Smith .................. G09G 3/3233
345/204
2011/0001711 A1 1/2011 Choi et al.

FOREIGN PATENT DOCUMENTS

CN    101943974 A    1/2011
CN    102034426 A    4/2011
(Continued)

OTHER PUBLICATIONS

International Search Report Appln. No. PCT/CN2013/081378; Dated Feb. 25, 2014.
(Continued)

*Primary Examiner* — Liliana Cerullo
(74) *Attorney, Agent, or Firm* — Ladas & Parry LLP

(57) ABSTRACT

It is provided a touch display driving circuit, a method thereof and a display apparatus, wherein the touch display driving circuit includes a driving transistor, a touch sensing unit, and a compensation driving unit; wherein the driving transistor drives a pixel display element to perform the displaying of the pixel; the touch sensing unit receives a touch control signal, and to control the compensation driving unit to drive the driving transistor according to the received touch control signal; the compensation driving unit
(Continued)

drives the driving transistor, and to adjust the gate-source voltage of the driving transistor as driving the driving transistor, so that a compensation amount of the gate-source voltage and a threshold voltage are counteracted. The technical solutions of the embodiments of the disclosure are capable of achieving an integration of the touch control with the driven displaying, which reduces a thickness of the display screen.

17 Claims, 5 Drawing Sheets

(51) Int. Cl.
*G09G 3/32* (2016.01)
*G09G 3/3233* (2016.01)
*G06F 3/041* (2006.01)
*G09G 3/3258* (2016.01)
*G09G 3/3275* (2016.01)

(52) U.S. Cl.
CPC ......... *G09G 3/3233* (2013.01); *G09G 3/3258* (2013.01); *G09G 3/3275* (2013.01); *G09G 2300/0426* (2013.01); *G09G 2300/0814* (2013.01); *G09G 2300/0819* (2013.01); *G09G 2300/0871* (2013.01); *G09G 2310/0251* (2013.01); *G09G 2320/045* (2013.01); *G09G 2320/0626* (2013.01)

(56) References Cited

FOREIGN PATENT DOCUMENTS

CN 202564685 U 12/2012
EP 2523182 A1 11/2012

OTHER PUBLICATIONS

International Search Report Appln. No. PCT/CN2013/081378; Dated Mar. 13, 2014.
Written Opinion of the International Searching Authority Appln. No. PCT/CN2013/081378; Dated Mar. 13, 2014.
First Chinese Office Action Appln. No. 201310210265.X; Dated Aug. 5, 2015.
International Preliminary Report on Patentability Appln. No. PCT/CN2013/081378; Dated Dec. 1, 2015.

\* cited by examiner

TOUCH DISPLAY DRIVING CIRCUIT, METHOD THEREOF AND DISPLAY APPARATUS

TECHNICAL FIELD OF THE DISCLOSURE

The present disclosure relates to a field of display technique, and particularly to a touch display driving circuit, a method thereof and a display apparatus.

BACKGROUND

A touch screen has gained more and more attention in the market of the consumer electronics. Currently, as a human-machine interaction interface, the touch screen has been widely used in portable electronic devices, such as displays of mobile phones, laptop computers, digital cameras, etc. The touch screen can be divided into two classes according to the technique employed therein, i.e., an external touch screen and an in-cell touch screen. The external touch screen, in which a touch apparatus is disposed on a display panel, has been widely used in the mobile application products such as mobile phones and the like; nevertheless, the external touch screen has a high cost and is relatively thicker. When the touch screen is required to be made larger and larger in size, the above two disadvantages of the external touch screen emerge notably. At present, consumer electronics, such as mobile phones, tablet computers or the like, needs to be made smaller, thinner and lighter, and the above two disadvantages can be removed from the in-cell touch screen since it is integrated with the display panel.

An application of an Active Matrix Organic Light Emitting Diode (referred to AMOLED for short) is more and more important. In the AMOLED, a display element of a pixel is an Organic Light Emitting Diode (hereinafter referred to OLED for short). The AMOLED can emit light when it is driven by a driving current generated in a driving thin film transistor in a saturation state. At present, generally, a driving circuit for AMOLED employs a conventional 2T1C circuit comprising two TFTs and a storage capacitor.

The inventor(s) observe(s) that at least following problems exist in the prior art: the conventional 2T1C circuit can only achieve a driven displaying of the OLED, but has no function related to in-cell touch control; it is impossible to realize an integration of the in-cell touch control with the driven displaying of the OLED, which increases the thickness of the display screen.

SUMMARY

An embodiment of the present disclosure provides a touch display driving circuit, a method thereof and a display apparatus which are capable of achieving the integration of the touch control with the driven displaying of the OLED, which reduces the thickness of the display screen.

For achieving the above purposes, an embodiment of the disclosure provides a touch display driving circuit comprising a driving transistor, a touch sensing unit and a compensation driving unit, wherein the driving transistor is configured to drive a pixel display element to perform a displaying of the pixel; the touch sensing unit is configured to receive a touch control signal, and to control the compensation driving unit to drive the driving transistor to perform the displaying of the pixel according to the received touch control signal; the compensation driving unit is configured to drive the driving transistor to perform the displaying of the pixel, and to adjust a gate-source voltage of the driving transistor as driving the driving transistor to perform the displaying of the pixel, so that a compensation amount of the gate-source voltage and a threshold voltage are counteracted.

Optionally, the compensation driving unit comprises a first switch transistor and a voltage-regulating module; wherein a gate of the first switch transistor is connected to a first control line, a first electrode of the first switch transistor is connected to a data line, and a second electrode of the switch transistor is connected to the voltage-regulating module;

a gate of the driving transistor is connected to the voltage-regulating module, a first electrode of the driving transistor is connected to the voltage-regulating module, and a second electrode of the driving transistor is connected to the voltage-regulating module;

the voltage-regulating module is connected to a first power supply and the first control line, and is connected to the touch sensing unit; the touch sensing unit is connected to a third power supply.

Optionally, the pixel display element is connected to the first electrode of the driving transistor, and is connected to a second power supply. Optionally, the touch sensing unit comprises a photoelectric diode, a sixth switch transistor, a ninth switch transistor and an eighth switch transistor; wherein one terminal of the photoelectric diode is connected to the third power supply, and the other terminal of the photoelectric diode is connected to a first electrode of the ninth switch transistor;

a gate of the sixth switch transistor is connected to a third control line, a first electrode of the sixth switch transistor is connected to a second electrode of the ninth switch transistor and the voltage-regulating module, and a second electrode of the sixth switch transistor is connected to the voltage-regulating module;

a gate of the ninth switch transistor is connected to a fourth control line, and the second electrode of the ninth switch transistor is connected to the voltage-regulating module;

a gate of the eighth switch transistor is connected to the fourth control line, a first electrode of the eighth switch transistor is connected to the voltage-regulating module and the second electrode of the driving transistor, and a second electrode of the eighth switch transistor is connected to a reading line;

Optionally, the voltage-regulating module comprises a storage capacitor, a second switch transistor, a third switch transistor and a fourth switch transistor; wherein a gate of the second switch transistor is connected to the first control line, a first electrode of the second switch transistor is connected to the second electrode of the ninth switch transistor and the first electrode of the sixth switch transistor, and a second electrode of the second switch transistor is connected to the storage capacitor and the second electrode of the first switch transistor;

a gate of the third switch transistor is connected to the first control line, a first electrode of the third switch transistor is connected to the storage capacitor and a first electrode of the fourth switch transistor, and a second electrode of the third switch transistor is connected to the first power supply;

a gate of the fourth switch transistor is connected to a fifth control line, a first electrode of the fourth switch transistor is connected to the storage capacitor, and a second electrode of the fourth switch transistor is connected to the first electrode of the eighth switch transistor and the second electrode of the driving transistor.

Optionally, the touch display driving circuit comprises a plurality of stages connected in cascade, wherein the first control line, the second control line and the third control line are configured to receive signals inputted from the voltage source of the present stage of touch display driving circuit, and the fourth control line and the fifth control line are configured to receive voltage signals outputted from a previous stage of touch display driving circuit.

Optionally, the voltage-regulating module further comprises a seventh switch transistor;

wherein a gate of the seventh switch transistor is connected to the second control line, a first electrode of the seventh switch transistor is connected to the pixel display element and the second power supply, a second electrode of the seventh switch transistor is connected to the second electrode of the sixth switch transistor, the first electrode of the driving transistor and the pixel display element.

Optionally, the first power supply is configured to provide a reference voltage;

the third power supply is configured to provide the reference voltage; and a negative electrode of the pixel display element is connected to the first electrode of the driving transistor, and a positive electrode of the pixel display element is connected to the second power supply.

Optionally, the first switch transistor, the fourth switch transistor, the eighth switch transistor and the ninth switch transistor are P type Thin Film Transistors (TFTs);

the second switch transistor, the third switch transistor, the sixth switch transistor, the seventh switch transistor and the driving transistor are N type TFTs.

Optionally, the second power supply is configured to provide the reference voltage;

the third power supply is configured to provide the reference voltage; and the positive electrode of the pixel display element is connected to the first electrode of the driving transistor, and the negative electrode of the pixel display element is connected to the first power supply.

Optionally, the first switch transistor, the fourth switch transistor, the eighth switch transistor and the ninth switch transistor are the N type TFTs;

the second switch transistor, the third switch transistor, the sixth switch transistor, the seventh switch transistor and the driving transistor are the P type TFTs;

For achieving the above purpose, an embodiment of the disclosure provides a display apparatus comprising a control unit, a first control line, a second control line, a third control line, a fourth control line, a fifth control line, a data line driving unit, data lines, a reading unit, reading lines and a touch display driving circuit; wherein the control unit is configured to drive the first control line, the second control line, the third control line, the fourth control line and the fifth control line; the data line driving unit is configured to drive the data lines; the reading unit is configured to read signals on the reading lines;

the touch display driving circuit is the touch display driving circuit described as above.

For achieving the above purpose, an embodiment of the disclosure provides a touch display driving method based on the touch display driving circuit comprising a pixel display element, a first switch transistor, a voltage-regulating module, a driving transistor and a touch sensing unit; wherein the method comprises:

turning on the first switch transistor under a control of the first control line, so that the data line supplies a voltage to the storage capacitor via the first switch transistor;

turning on the eighth switch transistor under a control of the fourth control line, so that the reading line reads a current flowing through the driving transistor to determine whether a touch occurs; and controlling the voltage-regulating module by the first control line, the second control line, the third control line, the fourth control line and the fifth control line, so that the driving transistor drives the pixel display element to emit light.

Optionally, the voltage-regulating module comprises a storage capacitor, a second switch transistor, a third switch transistor and a fourth switch transistor;

wherein controlling the voltage-regulating module by the first control line, the second control line, the third control line, the fourth control line and the fifth control line so that the driving transistor drives the pixel display element to emit light particularly comprises:

the second switch transistor and the third switch transistor are turned on under a control of a high level, the first switch transistor and the fourth switch transistor are turned on under a control of a low level, and the eighth switch transistor is turned off under a control of a high level, so that the voltage across the storage capacitor controls the driving transistor to drive the pixel display element to emit light.

The embodiments of the disclosure provide a touch display driving circuit, a method thereof and a display apparatus; wherein the touch display driving circuit comprises the driving transistor, the touch sensing unit and the compensation driving unit; wherein the driving transistor is configured to drive the pixel display element to perform the displaying of the pixel; the touch sensing unit is configured to receive the touch control signal, and to control the compensation driving unit to drive the driving transistor to perform the displaying of the pixel according to the received touch control signal; the compensation driving unit is configured to drive the driving transistor to perform the displaying of the pixel, and to adjust the gate-source voltage of the driving transistor as driving the driving transistor f to perform the displaying of the pixel, so that the compensation amount of the gate-source voltage and the threshold voltage are counteracted; thus, the technical solutions of the embodiments of the disclosure can achieve the integration of the touch control and the driven displaying of OLED, which reduces the thickness of the display screen.

DETAILED DESCRIPTION

In order to make those skilled in the art to understand the technical solutions of the embodiments of the disclosure more clearly, detailed descriptions will be given to a touch display driving circuit, a method therefore and a display apparatus in connection with the accompanying drawings.

Figure 1:
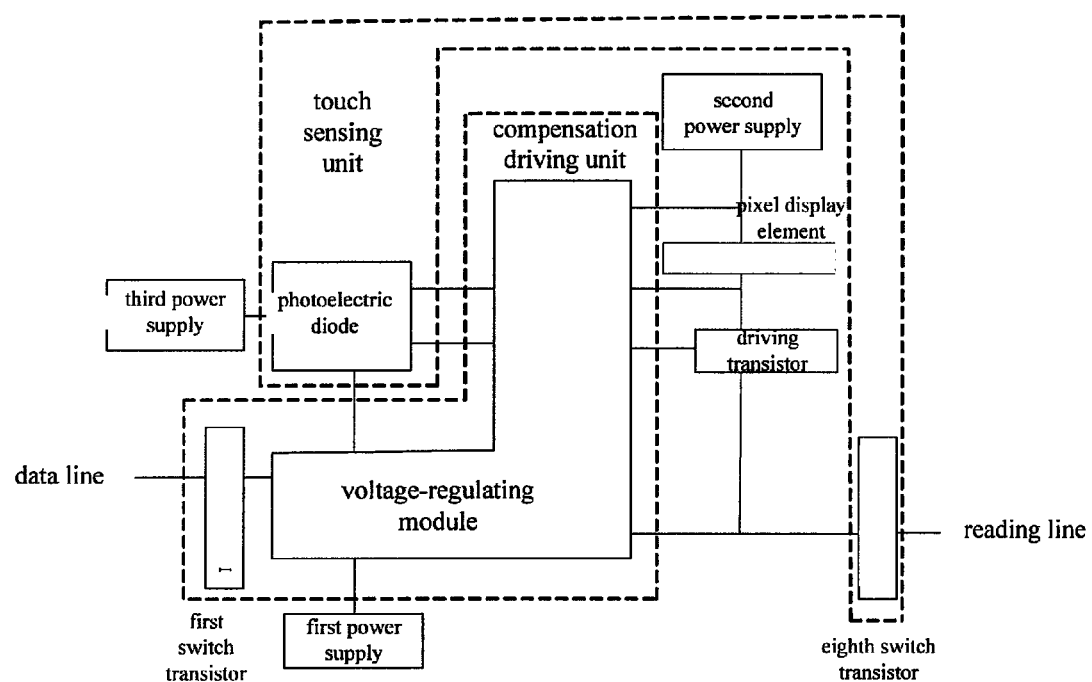
FIG. 1 is a schematic structural diagram of a touch display driving circuit provided in a first embodiment of the disclosure.

FIG. 1 is a schematic structural diagram of a touch display driving circuit provided in a first embodiment of the disclosure. As shown in FIG. 1, the touch display driving circuit comprises a driving transistor, a touch sensing unit and a compensation driving unit, wherein the driving transistor is configured to drive a pixel display element to perform a displaying of the pixel; the touch sensing unit is configured to receive a touch control signal, and to control the compensation driving unit to drive the driving transistor to perform the displaying of the pixel according to the received touch control signal; the compensation driving unit is configured to drive the driving transistor to perform the displaying of the pixel, and to adjust a gate-source voltage of the driving transistor as driving the driving transistor to perform the displaying of the pixel, so that a compensation amount of the gate-source voltage and a threshold voltage are counteracted.

In an example, a gate of a first switch transistor T1 is connected to a first control line CR1, a first electrode of the first switch transistor T1 is connected to a data line, and a second electrode of the switch transistor 11 is connected to a voltage-regulating module; a gate of the eighth switch transistor T8 is connected to a fourth control line CR1_N-1, a first electrode of the eighth switch transistor T8 is connected to the voltage-regulating module and a second electrode of the driving transistor T5, and a second electrode of the eighth switch transistor T8 is connected to a reading line; a gate of the driving transistor T5 is connected to the voltage-regulating module, a first electrode of the driving transistor T5 is connected to the voltage-regulating module, and a second electrode of the driving transistor T5 is connected to the voltage-regulating module; the voltage-regulating module is connected to a first power supply and the first control line CR1, and is connected to the touch sensing unit; the touch sensing unit is connected to a third power supply. The pixel display element D1 is connected to the first electrode of the driving transistor T5, and the pixel display element D1 is also connected to a second power supply.

As an example, in the present embodiment, the pixel display element may be an OLED. The first switch transistor T1 and the eighth switch transistor T8 are P-type TFTs, and the driving transistor T5 is an N-type TFT; the first power supply provides a reference voltage VSS, the second power supply provides a voltage VDD, and the third power supply provides the reference voltage VSS.

As another example, in the present embodiment, the first switch transistor T1 and the eighth switch transistor T8 may also be the N-type TFTs, and the driving transistor T5 may be the P-type TFT; the first power supply provides the voltage VDD, the second power supply provides the reference voltage VSS, and the third power supply provides the reference voltage VSS.

In an embodiment of the disclosure, if the first power supply provides the reference voltage, the second power supply provides a voltage higher than the reference voltage; and if the second power supply provides a reference voltage, the first power supply provides a voltage higher than the reference voltage; herein, VDD may be a high level, and VSS as the reference voltage may be a low level.

In the present embodiment, the touch sensing unit and the compensation driving unit are disposed in the touch display driving circuit, wherein the touch sensing unit can generate a variation of a current signal due to a light radiation to cause a variation of a voltage signal, and the varied voltage signal is transmitted to an external control circuit via the driving transistor T5 and the eight switch transistor T8, so that the external control circuit can determine whether a touch occurs; after it is determined that the touch occurs, the compensation driving unit can adjust the gate-source $V_{gs}$ of the driving transistor T5, so that a driving current of the driving transistor T5 in a saturation state, which is in the touch display driving circuit, is independent of a threshold voltage $V_{th}$ thereof.

In an example, the voltage-regulating module can adjust the threshold voltage $V_{th}$ so that components of the gate-source voltage $V_{gs}$ contains the threshold voltage $V_{th}$, and in turn the threshold voltage $V_{th}$ is cancelled in the driving current $I=K(V_{gs}-V_{th})^2$, and finally the driving current is independent of the threshold voltage $V_{th}$. Herein, the driving transistor T5 refers to a transistor for providing the driving current to the pixel display element D1, the threshold voltage refers to the threshold voltage of the driving transistor T5, and the gate-source voltage refers to the difference between a gate voltage $V_g$ and a source voltage Vs of the driving transistor T5.

The touch display driving circuit provided in the present embodiment comprises the driving transistor, the touch sensing unit and the compensation driving unit, wherein the driving transistor is configured to drive the pixel display element to perform the displaying of the pixel; the touch sensing unit is configured to receive the touch control signal and control the compensation driving unit to drive the driving transistor to perform the displaying of the pixel according to the received touch control signal; the compensation driving unit is configured to drive the driving transistor to perform the displaying of the pixel, and to adjust the gate-source voltage of the driving transistor as driving the driving transistor to perform the displaying of the pixel, so that the compensation amount of the gate-source voltage and the threshold voltage are counteracted, which can achieve the integration of the touch control and the driven displaying of the pixel display elements, reduce the thickness of the display screen, improve a luminance and an uniformity of the display screen, and reduce the cost.

Figure 2:
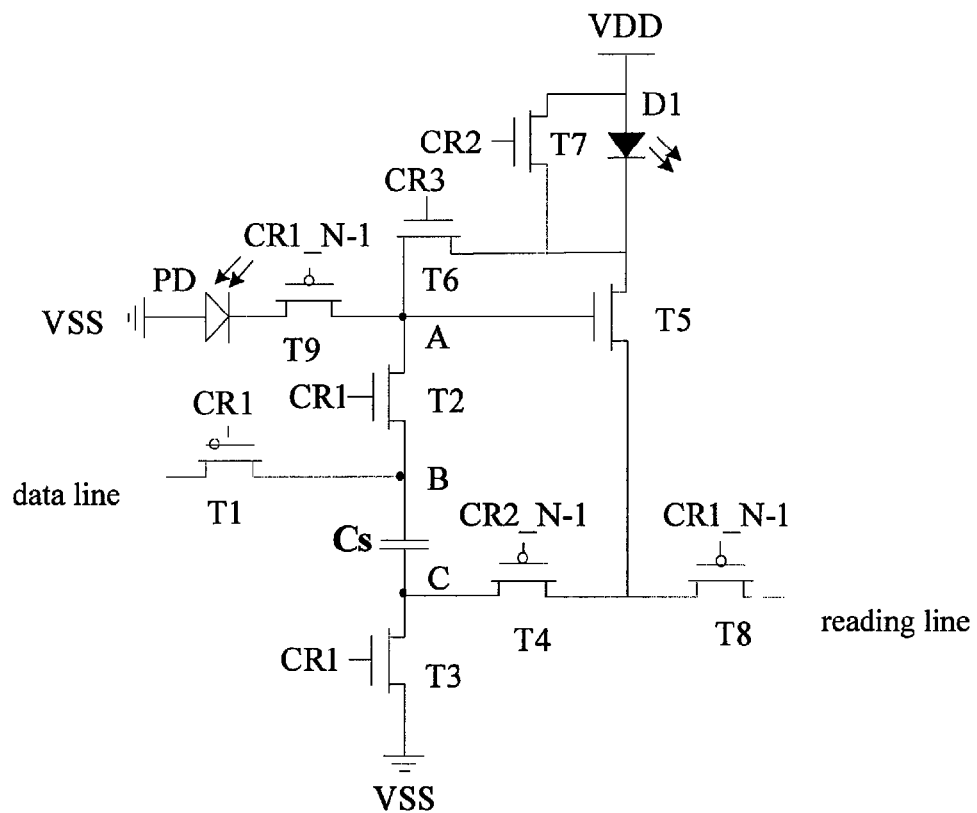
FIG. 2 is a schematic structural diagram of a touch display driving circuit provided in a second embodiment of the disclosure.

FIG. 2 is a schematic structural diagram of a touch display driving circuit provided in the second embodiment of the present disclosure. As shown in FIG. 2, on the basis of the first embodiment, the touch sensing unit in the present embodiment comprises a sensing element, a sixth switch transistor T6, a ninth switch transistor T9 and an eighth switch transistor T8.

In the second embodiment shown in FIG. 2, although the sensing element is illustrated as a photoelectric diode (referred to a PD in short), the photoelectric diode may be replaced by a touch capacitor. The case in which the photoelectric diode is replaced by the touch capacitor is not shown in FIG. 2.

In an example, one terminal of the photoelectric diode is connected to the third power supply VSS, and the other terminal of the photoelectric diode is connected to a first electrode of the ninth switch transistor T9; a gate of the sixth switch transistor T6 is connected to a third control line CR3, a first electrode of the sixth switch transistor T6 is connected to a second electrode of the ninth switch transistor T9 and the voltage-regulating module, and a second electrode of the sixth switch transistor T6 is connected to the voltage-regulating module; a gate of the ninth switch transistor T9 is connected to a fourth control line CR1_N-1, and the second electrode of the ninth switch transistor T9 is connected to the voltage-regulating module.

In an example, the voltage-regulating module in the present embodiment comprises a storage capacitor Cs, a second switch transistor T2, a third switch transistor T3 and a fourth switch transistor T4; wherein a gate of the second switch transistor T2 is connected to the first control line CR1, a first electrode of the second switch transistor T2 is connected to the second electrode of the ninth switch transistor T9 and the first electrode of the sixth switch transistor T6, and a second electrode of the second switch transistor T2 is connected to the storage capacitor Cs and the second electrode of the first switch transistor T1; a gate of the third switch transistor T3 is connected to the first control line CR1, a first electrode of the third switch transistor T3 is connected to the storage capacitor Cs and a first electrode of the fourth switch transistor T4, and a second electrode of the third switch transistor T3 is connected to the first power supply.

In another example, the voltage-regulating module in the present embodiment can further comprise a seventh switch transistor T7; wherein a gate of the seventh switch transistor T7 is connected to the second control line CR2, a first electrode of the seventh switch transistor T7 is connected to the pixel display element D1 and the second power supply, a second electrode of the seventh switch transistor T7 is connected to the second electrode of the sixth switch transistor T6, the first electrode of the driving transistor T5 and the pixel display element D1. The first electrode and the second electrode of the seventh switch transistor T7 are connected to the two terminals of the pixel display element D respectively, and the seventh switch transistor T7 is configured to short-circuit the pixel display element D1 when the driving transistor T5 generates an improper driving current, in order to prevent the pixel display element D1 from emitting light under an effect of the improper driving current and in turn generating an improper light-emitting intensity which may render a display error; and the seventh switch transistor T7 is further configured to connect the pixel display element D1 to the driving transistor T5 when the driving transistor T5 generates a proper driving current so that the pixel display element D1 emits light under an effect of the proper driving current, which can ensure a normal display.

In the present embodiment, the first power supply provides the reference voltage VSS, and the third power supply provides the reference voltage VSS; the negative electrode of the pixel display element D1 is connected to the first electrode of the driving transistor T5, and the positive electrode of the pixel display element D1 is connected to the second power supply VDD.

In an example, the first switch transistor T1, the fourth switch transistor T4, the eighth switch transistor T8 and the ninth switch transistor 19 are the P type TFTs; the second switch transistor T2, the third switch transistor T3, the sixth switch transistor T6, the seventh switch transistor T7 and the driving transistor T5 are the N type TFTs.

Figure 3:
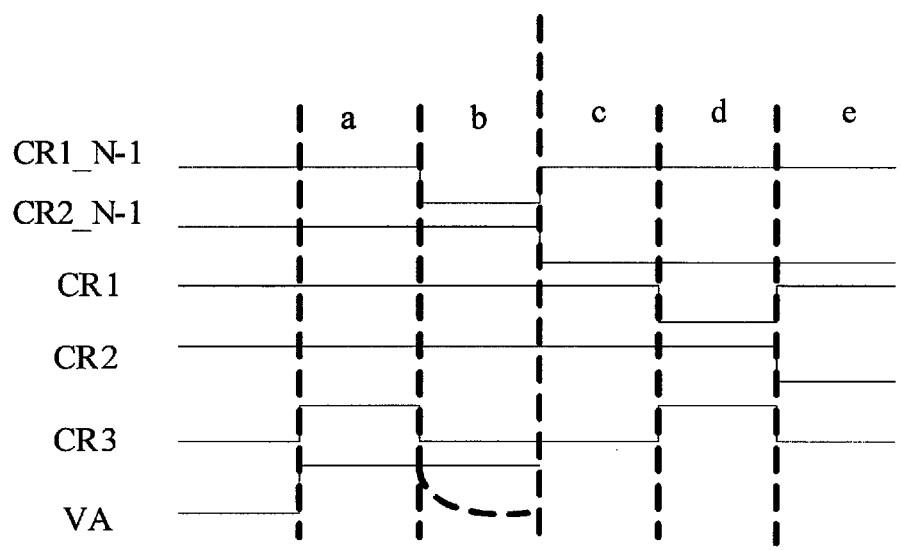
FIG. 3 is a schematic diagram illustrating input voltages of the touch display driving circuit provided in the second embodiment of the disclosure.
Figure 4:
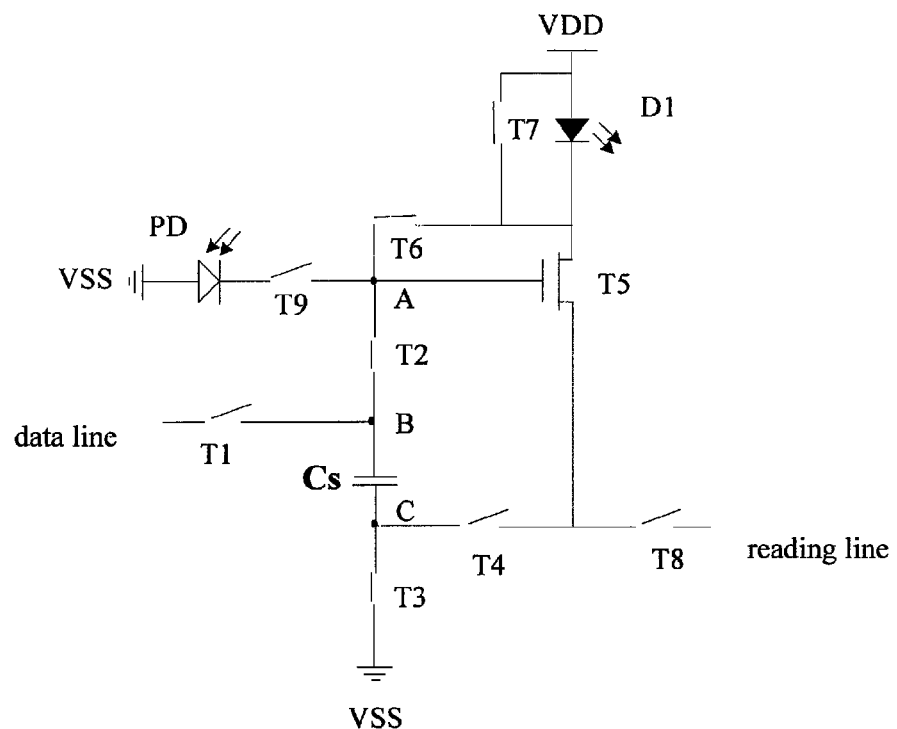
FIG. 4 is an equivalent circuit diagram of the touch display driving circuit provided in the second embodiment of the disclosure in an initial phase.

Hereinafter, a detailed description will be given to an operational procedure of the touch display driving circuit provided in the present embodiment in connection with FIGS. 3-8. FIG. 3 is a schematic diagram of the input voltages of the touch display driving circuit provided in the second embodiment, wherein "a" denotes an initial phase, "b" denotes a touch reading phase, "c" denotes a buffering phase, and "d" denotes a charging phase, and "e" denotes a light-emitting phase. FIG. 4 is a schematic equivalent circuit diagram of the touch display driving circuit provided in the second embodiment in the initial phase. As illustrated in FIGS. 3 and 4, during the initial phase, a voltage supplied from the first control line CR1 is at a high level, a voltage supplied from the second control line CR2 is at a high level, a voltage supplied from the third control line CR3 is at a high level, the fourth control line CR1_N-1 is at a high level, and the fifth control line CR2_N-1 is at a high level; at this time, the second switch transistor T2, the third switch transistor T3, the sixth switch transistor T6 and the seventh switch transistor T7 are turned on; and the first switch transistor T1, the fourth switch transistor T4, the eighth switch transistor 18 and the ninth switch transistor T9 are turned off. Thus, a schematic equivalent circuit of the touch display driving circuit shown in FIG. 2 in the initial phase is illustrated in FIG. 4. At this time, VDD is written into the node A, VA=VB=VDD, VC=VSS, the voltage across the storage capacitor Cs VCs=VA−VC=VDD−VSS; herein, Vss denotes the reference voltage supplied from the first power supply, and VDD denotes the voltage supplied from the second power supply; the voltage VDD supplied from the second power supply is higher the reference voltage VSS supplied from the first power supply.

Figure 5:
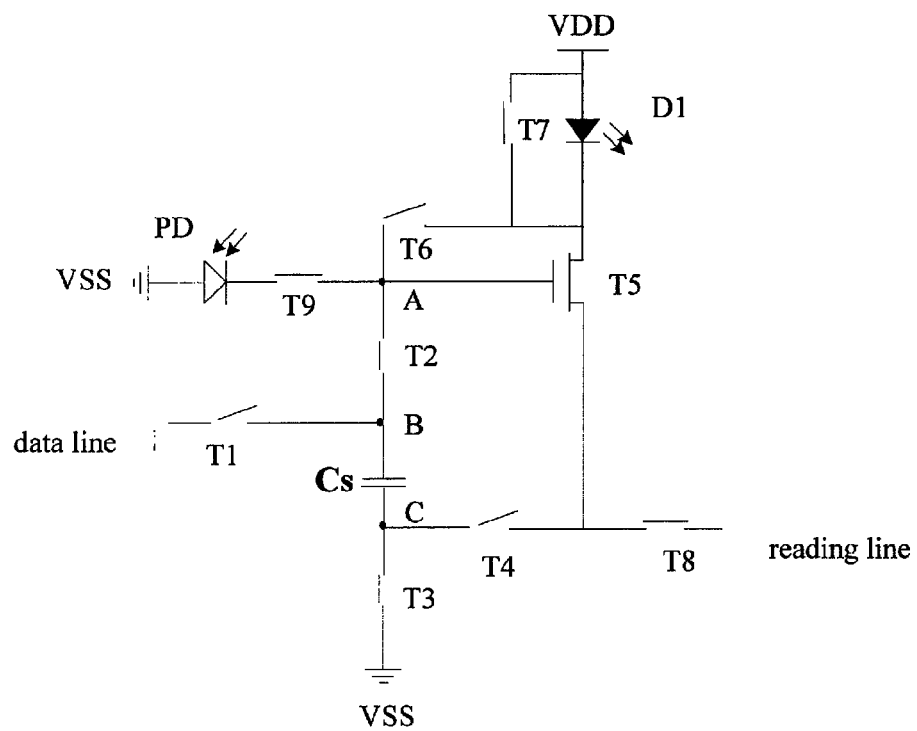
FIG. 5 is an equivalent circuit diagram of the touch display driving circuit provided in the second embodiment of the disclosure in touch and reading phases.

FIG. 5 is a schematic equivalent circuit diagram of the touch display driving circuit provided in the second embodiment in the touch and reading phase. As illustrated in FIGS. 3 and 5, when the touch sensing unit is touched and the external driving circuit reads, the voltage supplied from the first control line CR1 is at a high level, the voltage supplied from the second control line CR2 is at a high level, the voltage supplied from the third control line CR3 is at a low level, the fourth control line CR1_N-1 is at a low level, and the fifth control line CR2_N-1 is at a high level; at this time, the second switch transistor 12, the third switch transistor T3, the seventh switch transistor T7, the eighth switch transistor T8 and the ninth switch transistor T9 are turned on, and the first switch transistor T1, the fourth switch transistor T4 and the sixth switch transistor T6 are turned off. Thus, a schematic equivalent circuit of the touch display driving circuit shown in FIG. 2 in the touch and reading phase is illustrated in FIG. 5; at this time, the node A is connected to the photoelectric diode via the ninth switch transistor T9. A leakage current of the photoelectric diode when a touch occurs is different from that when no touch occurs. In particular, when no touch occurs, the photoelectric diode would generate the leakage current when it is radiated by the light, and the leakage current is large; and when the touch occurs, the light, which is to be radiated to the photoelectric diode, is blocked, and the leakage current generated by the photoelectric diode is small. A change of the leakage current between a case in which the touch occurs and a case in which no touch occurs causes the voltage signal at the node A to vary, and the variation of the voltage signal at the node A is amplified by the driving transistor T5 and is transmitted to the reading line. The reading line is connected to an external control circuit which analyzes the variation of the voltage signal; it is determined whether the touch occurs, on the basis of the fact that the leakage current generated by the photoelectric diode under the light radiation is larger than that generated by the photoelectric diode when there is no light radiation.

Figure 6:
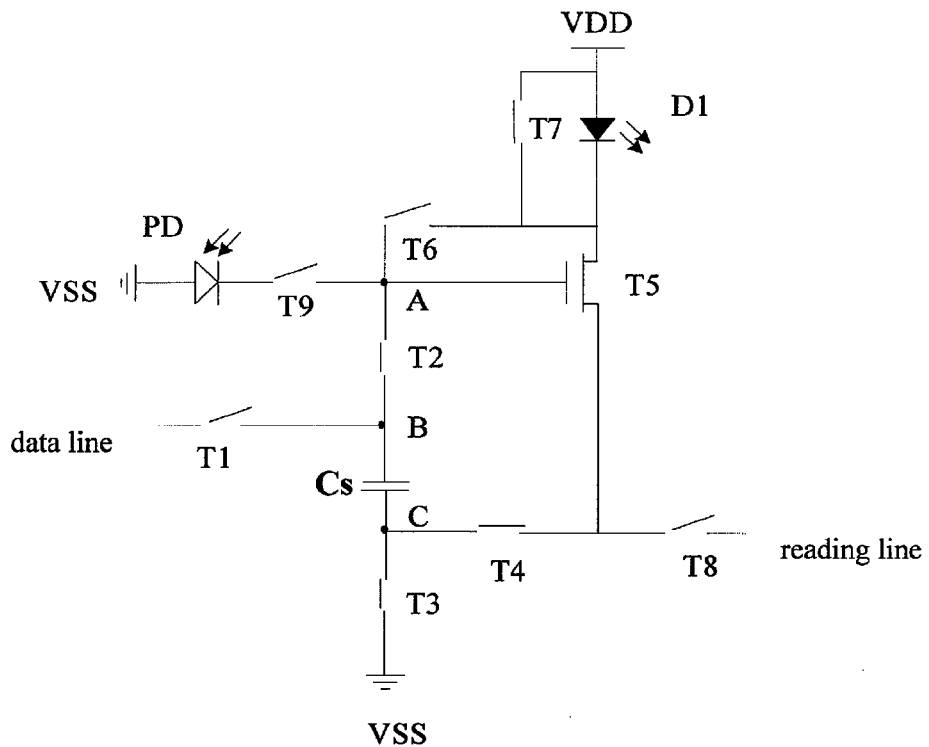
FIG. 6 is an equivalent circuit diagram of the touch display driving circuit provided in the second embodiment of the disclosure in a buffering phase.

FIG. 6 is a schematic equivalent circuit diagram of the touch display driving circuit provided in the second embodiment in the buffer phase. As illustrated in FIGS. 3 and 6, the voltage supplied from the first control line CR1 is at a high level, the voltage supplied from the second control line CR2 is at a high level, the voltage supplied from the third control line CR3 is at a low level, the fourth control line CR1_N-1 is at a high level, and the fifth control line CR2_N-1 is at a low level; at this time, the second switch transistor T2, the third switch transistor T3, the fourth switch transistor T4, and the seventh switch transistor T7 are turned on; and the first switch transistor T1, the sixth switch transistor T6, the eighth switch transistor T8 and the ninth switch transistor T9 are turned off. Thus, a schematic equivalent circuit of the touch display driving circuit shown in FIG. 2 in the buffer phase is illustrated in FIG. 6. At this time, the node A is discharged to the voltage VSS provided by the first power supply via the storage capacitor Cs, and the voltage at the node A decrease to VSS+$V_{th}$, wherein $V_{th}$ denotes the threshold voltage of the driving transistor T5, thus the effect of the touch in the previous phase is eliminated.

Figure 7:
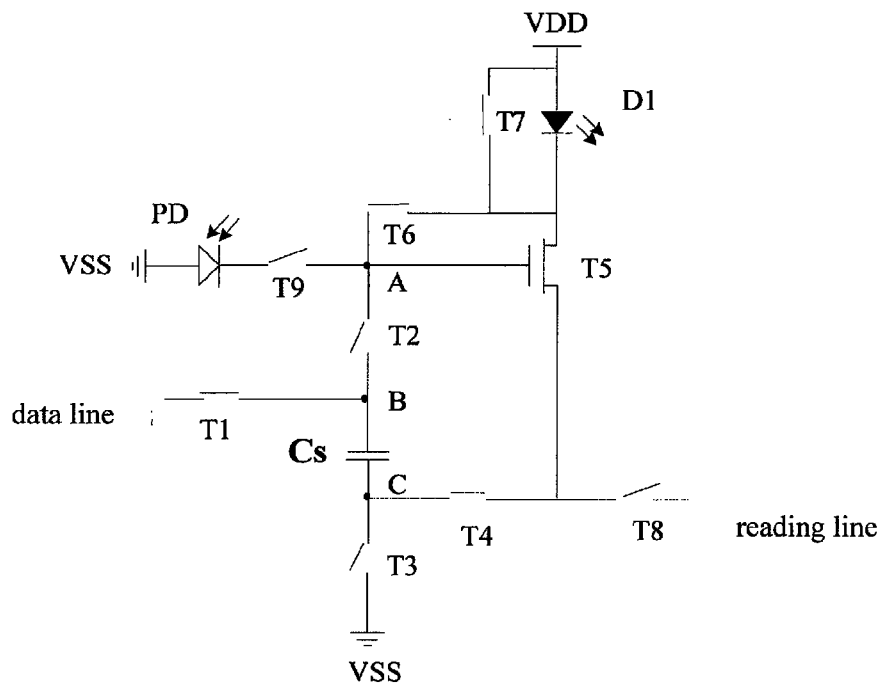
FIG. 7 is an equivalent circuit diagram of the touch display driving circuit provided in the second embodiment of the disclosure in a charging phase.

FIG. 7 is a schematic equivalent circuit diagram of the touch display driving circuit provided in the second embodiment in the charging phase. As illustrated in FIGS. 3 and 7, the voltage supplied from the first control line CR1 is at a low level, the voltage supplied from the second control line CR2 is at a high level, the voltage supplied from the third control line CR3 is at a high level, the fourth control line CR1_N-1 is at a high level, and the fifth control line CR2_N-1 is at a low level. Thus, a schematic equivalent circuit of the touch display driving circuit shown in FIG. 2 in the charging phase is illustrated in FIG. 7. At this time, the first switch transistor T1, the fourth switch transistor 14, the sixth switch transistor T6 and the seventh switch transistor T7 are turned on; and the second switch transistor T2, the third switch transistor T3, the eighth switch transistor T8 and the ninth switch transistor 19 are turned off. The data voltage $V_{data}$ provided by the data line is inputted, and the storage capacitor Cs is charged; at this time, the voltage at the node A is VDD, a voltage at a node B is $V_{data}$, a voltage at a node C is VDD–$V_{th}$, and the voltage across the storage capacitor Cs VCs=VB–VC=$V_{data}$–VDD+$V_{th}$, wherein $V_{th}$ denotes the threshold voltage of the driving transistor T5.

Figure 8:
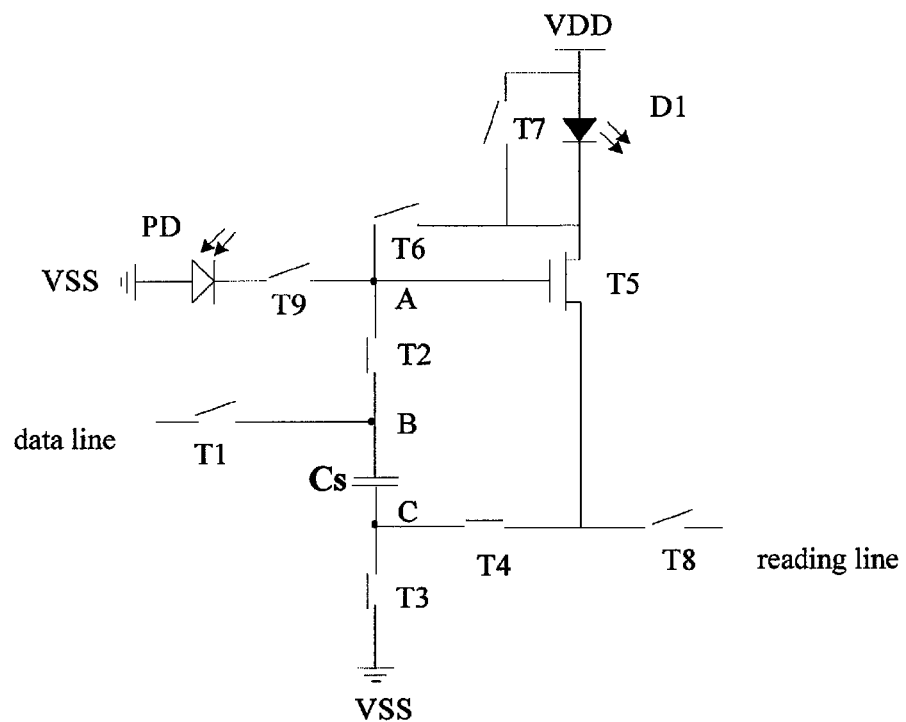
FIG. 8 is an equivalent circuit diagram of the touch display driving circuit provided in the second embodiment of the disclosure in a discharging phase.

FIG. 8 is a schematic equivalent circuit diagram of the touch display driving circuit provided in the second embodiment in the discharging phase. As illustrated in FIGS. 3 and 8, the voltage supplied from the first control line CR1 is at a high level, the voltage supplied from the second control line CR2 is at a low level, the voltage supplied from the third control line CR3 is at a low level, the fourth control line CR1_N-1 is at a high level, and the fifth control line CR2_N-1 is at a low level. At this time, the second switch transistor T2, the third switch transistor T3,=and the fourth switch transistor T4 are turned on; the first switch transistor T1, the sixth switch transistor T6 and the seventh switch transistor T7, the eighth switch transistor T8 and the ninth switch transistor T9 are turned off Thus, a schematic equivalent circuit of the touch display driving circuit shown in FIG. 2 in the discharging phase is illustrated in FIG. 8. At this time, the driving transistor T5 for the pixel display element D1 is driven by the voltage across the storage capacitor Cs, so that the pixel display element D1 begins to emit light. The node A, i.e., the gate of the driving transistor T5 is directly connected to the terminal B of the storage capacitor Cs; VA=VB, the voltage at the node C is VSS, the gate-source voltage of the driving transistor T5 $V_{gs}$=VAC=VBC= VCs=$V_{data}$–VDD+$V_{th}$, and the data voltage provided by the data line is higher than the voltage VDD provided by the second power supply; at this time, the current flowing through the pixel display element D1 is I=K($V_{gs}$–$V_{th}$)$^2$=K ($V_{data}$–VDD+$V_{th}$–$V_{th}$)$^2$=K($V_{data}$–VDD)$^2$, wherein K=$\mu_{eff}$× $C_{OX}$×(W/L)/2, $\mu_{eff}$ denotes an effective mobility of carries of the driving transistor T5, W denotes the channel width of the driving transistor 15, and L denotes the channel length of the driving transistor T5.

In the present embodiment, the touch sensing unit in the touch display driving circuit transmits the variation of the voltage signal to the external control circuit under the control of the driving transistor and the eighth switch transistor, so that the external control circuit can determine whether a touch occurs; after it is determined that the touch occurs, the storage capacitor Cs is charged, so that the voltage $V_{data}$ provided by the data line and the threshold voltage $V_{th}$ of the driving transistor are written to the storage capacitor; that is, in the charging phase, the voltage Vcs across the storage capacitor is charged to be equal to $V_{data}$–VDD+$V_{th}$; after that, the storage capacitor supplies the gate-source voltage to the driving transistor, so as to compensate the threshold voltage of the driving transistor. The driving transistor drives the pixel display element under the control of the voltage-regulating module, so that the driving current flowing through the driving transistor is independent of the threshold voltage $V_{th}$, of the driving transistor, which prevents the driving current flowing through the pixel display element from being affected by the non-uniformity and the drift of the threshold voltage $V_{th}$. Meanwhile, the driving current flowing through the driving transistor is also independent of its own turn-on voltage $V_{th\text{-}oled}$ of the pixel display element, which prevents the driving current from being affected by a rise of the turn-on voltage $V_{th\text{-}oled}$ due to an aging of the pixel display element; thus, the uniformity of the driving current flowing through the pixel display element is improved.

Figure 9:
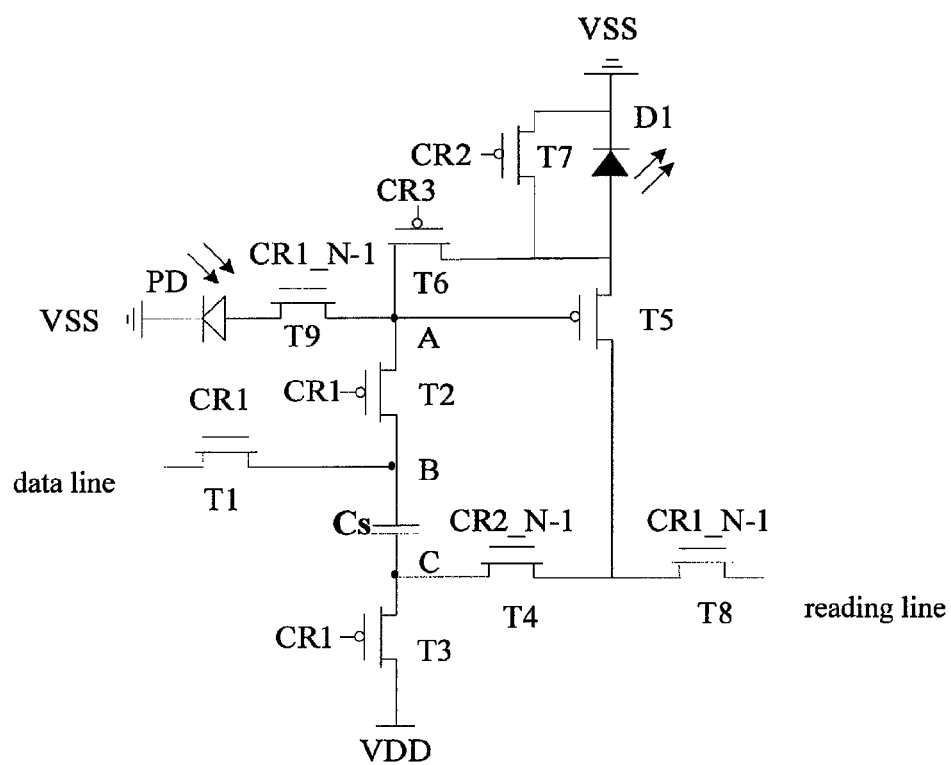
FIG. 9 is a schematic structural diagram of a touch display driving circuit provided in a third embodiment of the disclosure.

FIG. 9 is a schematic structural diagram of a touch display driving circuit provided in the third embodiment of the present disclosure. As shown in FIG. 9, on the basis of the first embodiment, the touch sensing unit in the present embodiment comprises a sensing element, a sixth switch transistor T6, a ninth switch transistor T9 and an eighth switch transistor T8.

In the third embodiment shown in FIG. 9, although the sensing element is illustrated as a photoelectric diode (referred to PD in short), the photoelectric diode can be replaced by a touch capacitor. The case in which the photoelectric diode is replaced by the touch capacitor is not shown in FIG. 9.

In an example, one terminal of the photoelectric diode is connected to the voltage VDD provided by the third power supply, and the other terminal of the photoelectric diode is connected to the first electrode of the ninth switch transistor T9; the gate of the sixth switch transistor T6 is connected to the third control line CR3, the first electrode of the sixth switch transistor T6 is connected to the second electrode of the ninth switch transistor T9 and the voltage-regulating module, and the second electrode of the sixth switch transistor T6 is connected to the voltage-regulating module; the gate of the ninth switch transistor T9 is connected to the fourth control line CR1_N-1, and the second electrode of the ninth switch transistor T9 is connected to the voltage-regulating module.

In an example, the voltage-regulating module in the present embodiment comprises the storage capacitor Cs, the second switch transistor T2, the third switch transistor T3 and the fourth switch transistor T4; wherein the gate of the second switch transistor T2 is connected to the first control line CR1, the first electrode of the second switch transistor T2 is connected to the second electrode of the ninth switch transistor T9 and the first electrode of the sixth switch transistor T6, and the second electrode of the second switch transistor T2 is connected to the storage capacitor Cs and the second electrode of the first switch transistor T1; the gate of the third switch transistor T3 is connected to the first control line CR1, the first electrode of the third switch transistor T3 is connected to the storage capacitor Cs and the first electrode of the fourth switch transistor T4, and the second electrode of the third switch transistor T3 is connected to the first power supply.

In another example, the voltage-regulating module in the present embodiment can further comprise the seventh switch transistor T7; wherein the gate of the seventh switch transistor T7 is connected to the second control line CR2, the first electrode of the seventh switch transistor T7 is connected to the pixel display element D1 and the second power supply, the second electrode of the seventh switch transistor T7 is connected to the second electrode of the sixth switch transistor 16, the first electrode of the driving transistor T5 and the pixel display element D1. The first electrode and the second electrode of the seventh switch transistor T7 are connected to the two terminals of the pixel display element D1 respectively, and the seventh switch transistor T7 is configured to short-circuit the pixel display element D1 when the driving transistor T5 generates an improper driving current, in order to prevent the pixel display element D1 from emitting light under the effect of the improper driving current and in turn from generating improper light-emitting intensity to render a display error; and the seventh switch transistor T7 is further configured to connect the pixel display element D1 to the driving transistor 15 when the driving transistor T5 generates the proper driving current so that the pixel display element D1 emits light under the effect of the proper driving current, ensuring the normal display.

In the present embodiment, the first power supply provides the reference voltage VSS, and the third power supply provides the voltage VDD; the positive electrode of the pixel display element D1 is connected to the first electrode of the driving transistor T5, and the negative electrode of the pixel display element D1 is connected to the reference voltage VSS provided by the first power supply.

In an example, the first switch transistor T1, the fourth switch transistor T4, the eighth switch transistor T8 and the ninth switch transistor T9 are the N type TFTs; the second switch transistor T2, the third switch transistor T3, the sixth switch transistor T6, the seventh switch transistor T7 and the driving transistor T5 are the P type TFTs.

The operational principle of the touch display driving circuit in the present embodiment can be referred to that of the second embodiment, and the detailed descriptions thereof are omitted herein.

The third embodiment differs from the second embodiment in that: in the third embodiment, one terminal of the photoelectric diode is connected to the voltage VDD provided by the third power supply, and the other terminal of the photoelectric diode is connected to the first electrode of the ninth switch transistor T9; the first switch transistor T1, the fourth switch transistor T4, the eighth switch transistor T8 and the ninth switch transistor T9 are the N type TFTs; the second switch transistor T2, the third switch transistor T3, the sixth switch transistor T6, the seventh switch transistor T7 and the driving transistor T5 are the P type TFTs. Further, the first power supply provides the reference voltage VSS, the second power supply provides the voltage VDD, and the third power supply provides the voltage VDD; the positive electrode of the pixel display element D1 is connected to the first electrode of the driving transistor T5, and the negative electrode of the pixel display element D1 is connected to the reference voltage VSS provided by the first power supply. The voltage provided by the second power supply can be higher than the reference voltage, wherein the voltage VDD can be a high level, and the voltage VSS as the reference voltage can be a low level accordingly.

In the touch display driving circuit provided in the present embodiment, the touch sensing unit transmits the variation of the voltage signal to the external control circuit under the control of the driving transistor and the eighth switch transistor, so that the external control circuit can determine whether a touch occurs; after it is determined that the touch occurs, the storage capacitor Cs is charged, so that the voltage $V_{data}$ provided by the data line and the threshold voltage $V_{th}$ of the driving transistor are written to the storage capacitor; that is, in the charging phase, the voltage Vcs across the storage capacitor is charged to be equal to $V_{data}-VDD+V_{th}$; after that, the storage capacitor supplies the gate-source voltage to the driving transistor, so as to compensate the threshold voltage of the driving transistor. The driving transistor drives the pixel display element under the control of the voltage-regulating module, so that the driving current flowing through the driving transistor is independent of the threshold voltage $V_{th}$ of the driving transistor, which prevents the driving current flowing through the pixel display element from being affected by the non-uniformity and the drift of the threshold voltage $V_{th}$. Meanwhile, the driving current flowing through the driving transistor is also independent of its own turn-on voltage $V_{th-oled}$ of the pixel display element, which prevents the driving current from being affected by a rise of the turn-on voltage $V_{th-oled}$ due to an aging of the pixel display element; thus, the uniformity of the driving current flowing through the pixel display element is improved.

In practical application, the touch display driving circuits provided in the above second and third embodiments not only can adopt polysilicon type of TFTs, but also can adopt other type of transistors.

It should be noted that in the embodiments of the present disclosure, for the first switch transistor T1, the second switch transistor T2, the third switch transistor T3, the fourth switch transistor T4, the driving transistor T5, the sixth switch transistor T6, the seventh switch transistor T7, the eighth switch transistor T8 and the ninth switch transistor T9, the first electrode and the second electrode serve as the source and the drain respectively. In the above transistors, the structure of the first electrode and the second electrode are symmetric. One of the first electrode and the second electrode, which transmits the carriers, serves as the source, and the other one, which receives the carriers, serves as the drain. In the practical application, for a transistor, the first electrode can serve as the source and the second electrode serves as the drain correspondingly, according to the location and the effect of the transistor in the circuit; or as an alternative, the first electrode can serve as drain and the second electrode serves as the source accordingly.

The fourth embodiment of the present disclosure provides a display apparatus comprising a control unit, a first control line, a second control line, a third control line, a fourth control line, a fifth control line, a data line driving unit, data lines, a reading unit, reading lines and a touch display driving circuit; wherein the control unit is configured to drive the first control line, the second control line, the third control line, the fourth control line and the fifth control line; the data line driving unit is configured to drive the data lines; the reading unit is configured to read signals on the reading lines; the touch display driving circuit is connected to the first control line, the second control line, the third control line, the fourth control line, the fifth control line, the data lines and the reading lines.

The display apparatus provided in the fourth embodiment employs the touch display driving circuit in the second embodiment or the third embodiment, and the implementation thereof can be referred to the second embodiment or the third embodiment, and the detailed descriptions are omitted herein.

The display apparatus provided in the fourth embodiment of the present disclosure comprises the control unit, the first control line, the second control line, the third control line, the fourth control line, the fifth control line, the data line driving unit, the data lines, the reading unit, the reading lines and the touch display driving circuit; wherein the control unit is configured to drive the first control line, the second control line, the third control line, the fourth control line and the fifth control line; the data line driving unit is configured to drive the data lines; the reading unit is configured to read signals on the reading lines; the touch display driving circuit is connected to the first control line, the second control line, the third control line, the fourth control line, the fifth control line, the data lines and the reading lines, so that the integration of the touch control and the driven displaying of the OLED can be achieved, which reduces the thickness of the display screen.

The fifth embodiment of the present disclosure provides a touch display driving method based on the touch display driving circuit comprising a pixel display element, a first switch transistor, a voltage-regulating module, a driving transistor, a touch sensing unit; the method comprises:

Step 101, the first switch transistor is turned on under the control of the first control line, so that the data line supplies a voltage to the storage capacitor via the first switch transistor;

Step 102, the eighth switch transistor is turned on under the control of the fourth control line, so that the reading line reads the current flowing through the driving transistor to determine whether a touch occurs; and Step 103, the voltage-regulating module is controlled by the first control line, the second control line, the third control line, the fourth control line and the fifth control line, so that the driving transistor drives the pixel display element to emit light.

The touch display driving method provided in the fifth embodiment can be achieved on the basis of the touch display driving circuit in the second embodiment or the third embodiment, and the implementation thereof can be referred to the second embodiment or the third embodiment, and the detailed descriptions are omitted herein.

The touch display driving method provided in the present embodiment is based on the touch display driving circuit comprising the driving transistor, the touch sensing unit, and the compensation driving unit; wherein the driving transistor is configured to drive the pixel display element to perform the displaying of the pixel; the touch sensing unit is configured to receive the touch control signal, and to control the compensation driving unit to drive the driving transistor to perform the displaying of the pixel according to the received touch control signal; the compensation driving unit is configured to drive the driving transistor to perform the displaying of the pixel, and to adjust the gate-source voltage of the driving transistor as driving the driving transistor to perform the displaying of the pixel, so that the compensation amount of the gate-source voltage and the threshold voltage are counteracted; thus, the integration of the touch control and the driven displaying of the pixel display element can be achieved, which reduces the thickness of the display screen.

The touch display driving circuit as described in the embodiments of the present disclosure can be a plurality of stages connected in cascade, wherein in each stage, the first control line, the second control line and the third control line receive signals inputted from the voltage source of the present stage of touch display driving circuit, and the fourth control line and the fifth control line receive voltage signals outputted from a previous stage of the touch display driving circuit. Of course, in the present embodiment, the manner in which the input signals are imported is not limited to this; for example, the fourth control line and the fifth control line can be configured to receive voltage signals from an external power supply instead of the voltage signals outputted from the previous stage of the touch display driving circuit.

It can be appreciated that the above implementations are only for illustrating the technical solutions of embodiments of the present disclosure, and in no way limit the scope of the present disclosure. For those skilled in the art, it is possible to make variations and improvements to the solutions of the embodiments of the present disclosure without departing from the spirit and scope of the embodiments of the present disclosure, and such variations and improvements are regarded as falling into the protection scope of the present invention.

What is claimed is:

1. A touch display driving circuit comprising a driving transistor, a touch sensing unit and a compensation driving unit, wherein
   the driving transistor is configured to drive a pixel display element to perform the displaying of the pixel;
   the touch sensing unit is configured to receive a touch control signal, and to control the compensation driving unit to drive the driving transistor to perform the displaying of the pixel according to the received touch control signal; and
   the compensation driving unit is configured to drive the driving transistor to perform the displaying of the pixel, and to adjust a gate-source voltage of the driving transistor as driving the driving transistor to perform the displaying of the pixel, so that a compensation amount of the gate-source voltage and a threshold voltage are counteracted,
   wherein the compensation driving unit comprises a first switch transistor and a voltage-regulating module;
   a gate of the first switch transistor is connected to a first control line, a first electrode of the first switch transistor is connected to a data line, and a second electrode of the switch transistor is connected to the voltage-regulating module;
   a gate of the driving transistor is connected to the voltage-regulating module, a first electrode of the driving transistor is connected to the voltage-regulating module, and a second electrode of the driving transistor is connected to the voltage-regulating module; and the voltage-regulating module is connected to a first power supply and the first control line, and is further connected to the touch sensing unit; the touch sensing unit is connected to a third power supply.

2. The touch display driving circuit according to claim 1, wherein the pixel display element is connected to the first electrode of the driving transistor, and is connected to a second power supply.

3. The touch display driving circuit according to claim 2, wherein the touch sensing unit comprises a photoelectric diode, a sixth switch transistor, a ninth switch transistor and an eighth switch transistor; wherein
   one terminal of the photoelectric diode is connected to the third power supply, and the other terminal of the photoelectric diode is connected to a first electrode of the ninth switch transistor;
   a gate of the sixth switch transistor is connected to a third control line, a first electrode of the sixth switch transistor is connected to a second electrode of the ninth switch transistor and the voltage-regulating module, and a second electrode of the sixth switch transistor is connected to the voltage-regulating module;
   a gate of the ninth switch transistor is connected to a fourth control line, and the second electrode of the ninth switch transistor is connected to the voltage-regulating module; and
   a gate of the eighth switch transistor is connected to the fourth control line, a first electrode of the eighth switch transistor is connected to the voltage-regulating module and the second electrode of the driving transistor, and a second electrode of the eighth switch transistor is connected to a reading line.

4. The touch display driving circuit according to claim 3, wherein the voltage-regulating module comprises a storage capacitor, a second switch transistor, a third switch transistor and a fourth switch transistor; wherein
   a gate of the second switch transistor is connected to the first control line, a first electrode of the second switch transistor is connected to the second electrode of the ninth switch transistor and the first electrode of the sixth switch transistor, and a second electrode of the second switch transistor is connected to the storage capacitor and the second electrode of the first switch transistor;
   a gate of the third switch transistor is connected to the first control line, a first electrode of the third switch transistor is connected to the storage capacitor and a first electrode of the fourth switch transistor, and a second electrode of the third switch transistor is connected to the first power supply; and
   a gate of the fourth switch transistor is connected to a fifth control line, a first electrode of the fourth switch transistor is connected to the storage capacitor, and a second electrode of the fourth switch transistor is connected to the first electrode of the eighth switch transistor and the second electrode of the driving transistor.

5. The touch display driving circuit according to claim 4, wherein the touch display driving circuit comprises a plurality of stages connected in cascade, wherein the first control line, a second control line and the third control line are configured to receive signals inputted from a voltage source of a present stage of touch display driving circuit, and the fourth control line and the fifth control line are configured to receive voltage signals outputted from a previous stage of touch display driving circuit.

6. The touch display driving circuit according to claim 4, wherein the voltage-regulating module further comprises a seventh switch transistor;
   a gate of the seventh switch transistor is connected to a second control line, a first electrode of the seventh switch transistor is connected to the pixel display element and the second power supply, a second electrode of the seventh switch transistor is connected to the second electrode of the sixth switch transistor, the first electrode of the driving transistor and the pixel display element.

7. The touch display driving circuit according to claim 4, wherein the first power supply is configured to provide a reference voltage, and the third power supply is configured to provide the reference voltage;
   a negative electrode of the pixel display element is connected to the first electrode of the driving transistor, and a positive electrode of the pixel display element is connected to a second power supply.

8. The touch display driving circuit according to claim 7, wherein the first switch transistor, the fourth switch transistor, the eighth switch transistor and the ninth switch transistor are P type Thin Film Transistors (TFTs);
   the second switch transistor, the third switch transistor, the sixth switch transistor, the seventh switch transistor and the driving transistor are N type TFTs.

9. The touch display driving circuit according to claim 4, wherein the second power supply is configured to provide a reference voltage, and the third power supply is configured to provide the reference voltage;
   a positive electrode of the pixel display element is connected to the first electrode of the driving transistor, and a negative electrode of the pixel display element is connected to the first power supply.

10. The touch display driving circuit according to claim 9, wherein the first switch transistor, the fourth switch transistor, the eighth switch transistor and the ninth switch transistor are N type TFTs;
    the second switch transistor, the third switch transistor, the sixth switch transistor, the seventh switch transistor and the driving transistor are P type TFTs.

11. A display apparatus comprising a control unit, a first control line, a second control line, a third control line, a fourth control line, a fifth control line, a data line driving unit, data lines, a reading unit, reading lines and a touch display driving circuit; wherein the control unit is configured to drive the first control line, the second control line, the third control line, the fourth control line and the fifth control line; the data line driving unit is configured to drive the data lines; the reading unit is configured to read signals on the reading lines;
    the touch display driving circuit comprises a driving transistor, a touch sensing unit and a compensation driving unit, wherein
    the driving transistor is configured to drive a pixel display element to perform the displaying of the pixel;
    the touch sensing unit is configured to receive a touch control signal, and to control the compensation driving unit to drive the driving transistor to perform the displaying of the pixel according to the received touch control signal; and
    the compensation driving unit is configured to drive the driving transistor to perform the displaying of the pixel, and to adjust a gate-source voltage of the driving transistor as driving the driving transistor to perform the displaying of the pixel, so that a compensation amount of the gate-source voltage and a threshold voltage are counteracted, wherein the compensation driving unit comprises a first switch transistor and a voltage-regulating module;

a gate of the first switch transistor is connected to a first control line, a first electrode of the first switch transistor is connected to a data line, and a second electrode of the switch transistor is connected to the voltage-regulating module;

a gate of the driving transistor connected to the voltage-regulating module, a first electrode of the driving transistor is connected to the voltage-regulating module, and a second electrode of the driving transistor is connected to the voltage-regulating module; and the voltage-regulating module is connected to a first power supply and the first control line, and is further connected to the touch sensing unit; the touch sensing unit is connected to a third power supply.

12. The display apparatus according to claim 11, wherein the pixel display element is connected to the first electrode of the driving transistor, and is connected to a second power supply.

13. The display apparatus according to claim 12, wherein the touch sensing unit comprises a photoelectric diode, a sixth switch transistor, a ninth switch transistor and an eighth switch transistor; wherein one terminal of the photoelectric diode is connected to the third power supply, and the other terminal of the photoelectric diode is connected to a first electrode of the ninth switch transistor;

a gate of the sixth switch transistor is connected to a third control one, a first electrode of the sixth switch transistor is connected to a second electrode of the ninth switch transistor and the voltage-regulating module, and a second electrode of the sixth switch transistor is connected to the voltage-regulating module;

a gate of the ninth switch transistor is connected to a fourth control line, and the second electrode of the ninth switch transistor is connected to the voltage-regulating module; and a gate of the eighth switch transistor is connected to the fourth control line, a first electrode of the eighth switch transistor is connected to the voltage-regulating module and the second electrode of the driving transistor, and a second electrode of the eighth switch transistor is connected to a reading line.

14. The display apparatus according to claim 13, wherein the voltage-regulating module comprises a storage capacitor, a second switch transistor, a third switch transistor and a fourth switch transistor; wherein a gate of the second switch transistor is connected to the first control line, a first electrode of the second switch transistor is connected to the second electrode of the ninth switch transistor and the first electrode of the sixth switch transistor, and a second electrode of the second switch transistor is connected to the storage capacitor and the second electrode of the first switch transistor;

a gate of the third switch transistor is connected to the first control line, a first electrode of the third switch transistor is connected to the storage capacitor and a first electrode of the fourth switch transistor, and a second electrode of the third switch transistor is connected to the first power supply; and a gate of the fourth switch transistor is connected to a fifth control line, a first electrode of the fourth switch transistor is connected to the storage capacitor, and a second electrode of the fourth switch transistor is connected to the first electrode of the eighth switch transistor and the second electrode of the driving transistor.

15. The display apparatus according to claim 14, wherein the touch display driving circuit comprises a plurality of stages connected in cascade, wherein the first control line, a second control line and the third control line are configured to receive signals inputted from a voltage source of a present stage of touch display driving circuit, and the fourth control line and the fifth control line are configured to receive voltage signals outputted from a previous stage of touch display driving circuit.

16. The display apparatus according to claim 14, wherein the voltage-regulating module further comprises a seventh switch transistor;

a gate of the seventh switch transistor is connected to a second control line, a first electrode of the seventh switch transistor is connected to the pixel display element and the second power supply, a second electrode of the seventh switch transistor is connected to the second electrode of the sixth switch transistor, the first electrode of the driving transistor and the pixel display element.

17. A touch display driving method based on a touch display driving circuit comprising a pixel display element, a first switch transistor, a voltage-regulating module, a driving transistor, a touch sensing unit; wherein the method comprises:

turning on the first switch transistor under a control of a first control line, so that a data line supplies a voltage to a storage capacitor via the first switch transistor;

turning on an eighth switch transistor under a control of a fourth control line, so that a reading line reads a current flowing through the driving transistor to determine whether a touch occurs; and controlling the voltage-regulating module by the first control line, a second control line, a third control line, the fourth control line and a fifth control line, so that the driving transistor drives the pixel display element to emit light, wherein the first switch transistor and the voltage-regulating module are configured to adjust a gate-source voltage of the driving transistor as driving the driving transistor to perform the displaying of the pixel, so that a compensation amount of the gate-source voltage and a threshold voltage are counteracted, wherein the voltage-regulating module comprises the storage capacitor, a second switch transistor, a third switch transistor and a fourth switch transistor; wherein controlling the voltage-regulating module by the first control line, the second control line, the third control line, the fourth control line and the fifth control line so that the driving transistor drives the pixel display element to emit light comprises:

turning on the second switch transistor and the third switch transistor under a control of a high level, turning on the first switch transistor and the fourth switch transistor under a control of a low level, and turning off the eighth switch transistor under a control of a high level, so that a voltage across the storage capacitor controls the driving transistor to drive the pixel display element to emit light.

* * * * *